(12) United States Patent
Aslanov et al.

(10) Patent No.: US 10,515,832 B2
(45) Date of Patent: Dec. 24, 2019

(54) LASER PROCESSING APPARATUS AND METHOD FOR MANUFACTURING THE SAME

(71) Applicant: Samsung Display Co. Ltd., Yongin-si (KR)

(72) Inventors: Emil Aslanov, Asan-si (KR); Je Kil Ryu, Yongin-si (KR); Hae Sook Lee, Hwaseong-si (KR); Young Geun Cho, Seoul (KR); Gyoo Wan Han, Yongin-si (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 0 days.

(21) Appl. No.: 15/809,537

(22) Filed: Nov. 10, 2017

(65) Prior Publication Data

US 2018/0158703 A1 Jun. 7, 2018

(30) Foreign Application Priority Data

Dec. 5, 2016 (KR) .......................... 10-2016-0164596

(51) Int. Cl.
| | | |
|---|---|---|
| H01L 21/67 | (2006.01) | |
| G02B 19/00 | (2006.01) | |
| G02B 27/12 | (2006.01) | |
| B23K 26/06 | (2014.01) | |
| G02B 26/08 | (2006.01) | |
| G02B 27/09 | (2006.01) | |
| H01L 27/12 | (2006.01) | |
| H01L 21/02 | (2006.01) | |
| G02B 27/00 | (2006.01) | |

(Continued)

(52) U.S. Cl.
CPC .... *H01L 21/67115* (2013.01); *B23K 26/0648* (2013.01); *B23K 26/0676* (2013.01); *G02B 3/0006* (2013.01); *G02B 19/0009* (2013.01); *G02B 19/0047* (2013.01); *G02B 26/0875* (2013.01); *G02B 27/0025* (2013.01); *G02B 27/0927* (2013.01); *G02B 27/123* (2013.01); *H01L 21/02686* (2013.01); *H01L 27/1274* (2013.01); *B23K 2103/56* (2018.08)

(58) Field of Classification Search
CPC combination set(s) only.
See application file for complete search history.

(56) References Cited

U.S. PATENT DOCUMENTS

| | | |
|---|---|---|
| 8,446,924 B2 | 5/2013 | Kawaguchi et al. |
| 9,387,552 B2 | 7/2016 | Cho et al. |
| | (Continued) | |

FOREIGN PATENT DOCUMENTS

| | | |
|---|---|---|
| JP | 2006287183 | 10/2006 |
| KR | 101161630 | 7/2012 |
| KR | 101242094 | 3/2013 |

*Primary Examiner* — Ratisha Mehta
(74) *Attorney, Agent, or Firm* — Cantor Colburn LLP

(57) ABSTRACT

A laser processing apparatus includes a laser beam generating unit which emits a laser beam, a lens unit which divides the laser beam into a plurality of laser beams, and a light condensing unit which condenses the plurality of laser beams. The lens unit includes a first lens array having a first central axis and a second lens array having a second central axis, and wherein at least one of the first lens array and the second lens array reciprocates such that the first central axis and the second central axis are deviated from each other.

21 Claims, 15 Drawing Sheets

(51) Int. Cl.
*G02B 3/00* (2006.01)
*B23K 26/067* (2006.01)
*B23K 103/00* (2006.01)

(56) References Cited

U.S. PATENT DOCUMENTS

2007/0196967 A1    8/2007  Graefe et al.
2012/0168421 A1*   7/2012  Kawaguchi ........ B23K 26/0608
                                              219/383

* cited by examiner

LASER PROCESSING APPARATUS AND METHOD FOR MANUFACTURING THE SAME

This application claims priority to Korean Patent Application No. 10-2016-0164596, filed on Dec. 5, 2016, and all the benefits accruing therefrom under 35 U.S.C. 119, the content of which in its entirety is herein incorporated by reference.

BACKGROUND

1. Field

Exemplary embodiments of the invention relate to a laser processing apparatus and a method for manufacturing the same.

2. Description of the Related Art

Laser processing refers to a method of performing processing at a high energy density by concentrating a laser beam at one point. A laser processing apparatus refers to an apparatus that performs processing such as cutting, patterning, and welding of materials, using a laser beam.

Recently, a semiconductor film applied to a thin film transistor has been produced by a laser annealing apparatus. The semiconductor film may be crystallized through laser annealing. The semiconductor film produced through the laser annealing may have high mobility and thus may be included in a display device.

SUMMARY

Exemplary embodiments of the invention provide a laser machining apparatus capable of reducing the occurrence of interference fringes by reciprocating at least two lens arrays such that their central axes are deviated from each other.

According to exemplary embodiments of the invention, the occurrence of interference fringes may be reduced by reciprocating at least two lens arrays such that their central axes are deviated from each other.

Further, by causing at least one of two lens arrays to reciprocate in a long axis direction of the laser beam, a vertical stripe phenomenon may be reduced.

An exemplary embodiment of the invention discloses a laser processing apparatus including a laser beam generating unit which emits a laser beam, a lens unit which divides the laser beam into a plurality of laser beams, and a light condensing unit which condenses the plurality of laser beams. The lens unit may include a first lens array having a first central axis and a second lens array having a second central axis and wherein at least one of the first lens array and the second lens array reciprocates such that the first central axis and the second central axis are deviated from each other.

An exemplary embodiment of the invention also discloses a laser processing apparatus including a laser beam generating unit which emits a laser beam, and a lens unit which flattens an energy intensity distribution of the laser beam. The lens unit may include a first lens array and a second lens array spaced apart from the first lens array by a predetermined distance, and wherein at least one of the first lens array and the second lens array reciprocates such that central axes of the first lens array and the second lens array are deviated from each other.

An exemplary embodiment of the invention discloses a laser processing method including emitting a laser beam to a lens unit, dividing, by the lens unit, the laser beam into a plurality of laser beams, and condensing the plurality of laser beams. The lens unit may include a first lens array and a second lens array, and wherein at least one of the first lens array and the second lens array reciprocates such that central axes of the first lens array and the second lens array are deviated from each other.

It is to be understood that both the foregoing general description and the following detailed description are exemplary and explanatory and are intended to provide further explanation of the invention as claimed.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
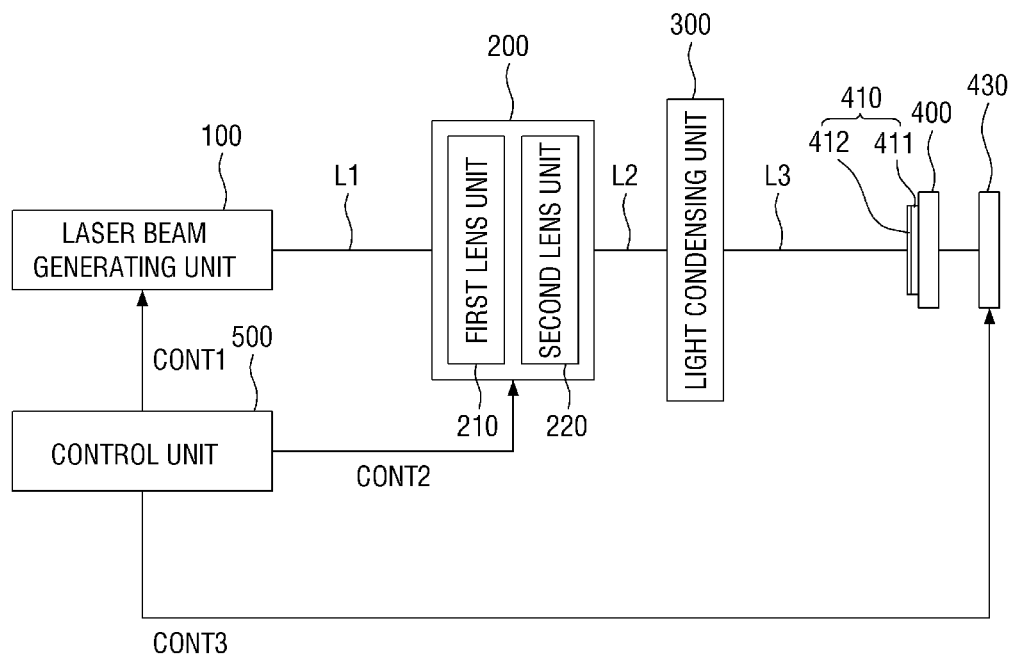
FIG. 1 is a block diagram schematically showing an exemplary embodiment of a laser processing apparatus according to the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying drawing figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). In an exemplary embodiment, "about" can mean within one or more standard deviations, or within ±30%, 20%, 10%, 5% of the stated value.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this invention is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

FIG. 1 is a block diagram schematically showing a laser processing apparatus according to an exemplary embodiment of the invention.

A laser processing apparatus 10 according to an exemplary embodiment of the invention may include a laser beam generating unit 100, a lens unit 200, and a light condensing unit 300.

The laser beam generating unit 100 emits a laser beam L1 to the lens unit 200. The laser beam generating unit 100 may emit the laser beam L1 continuously or discontinuously. Here, the laser beam L1 may be a single beam or multiple beams. Hereinafter, a case where the laser beam L1 is a single beam will be described as an example. The cross section of the laser beam L1 may have a rectangular shape in an exemplary embodiment. However, the invention is not limited thereto, and the cross section of the laser beam L1 may have various other shapes such as a circular or dot shape.

The lens unit 200 may include at least two lens units. Hereinafter, a case where the lens unit 200 includes a first lens unit 210 and a second lens unit 220 will be described as an example.

The lens unit 200 may divide the incident laser beam L1 into a plurality of laser beams L2. More specifically, the first lens unit 210 and the second lens unit 220 may divide the laser beam L1 in a direction corresponding to a long axis direction of the laser beam L1 in an exemplary embodiment. That is, the lens unit 200 may be a long-axis homogenizer in an exemplary embodiment.

Alternatively, the lens unit 220 may divide the laser beam L1 in a direction corresponding to a short axis direction of the laser beam L1 in another exemplary embodiment. In this case, the lens unit 200 may be a short-axis homogenizer in an exemplary embodiment, for example. This will be described later with reference to FIGS. 10 and 11.

A central axis of the first lens unit 210 may be deviated from a central axis of the second lens unit 220. Also, the first lens unit 210 and the second lens unit 220 may move in a predetermined direction. This will be described later.

The plurality of laser beams L2 divided by the lens unit 200 may be provided to the light condensing unit 300. The light condensing unit 300 may condense the plurality of laser beams L2. More specifically, the light condensing unit 300 may superpose the plurality of laser beams L2 divided in the long axis direction on the surface of a target object 410 in the long axis direction. That is, the light condensing unit 300 may be a long-axis condensing optical system in an exemplary embodiment.

A plurality of laser beams L3 condensed by the light condensing unit 300 may be provided to the target object 410 disposed on a stage 400. The type of the target object 410 is not particularly limited. In an exemplary embodiment, the target object 410 may be a semiconductor film 412 disposed on the surface of a substrate 411. The semiconductor film 412 may include an amorphous material. In an exemplary embodiment, the semiconductor film 412 may be an amorphous silicon (a-Si) film, a polycrystalline silicon film, or a compound semiconductor film having an amorphous structure, for example. In this case, the laser processing apparatus according to an exemplary embodiment of the invention may be a laser annealing apparatus that performs laser annealing on the semiconductor film. The semiconductor film provided by applying laser annealing has high charge mobility and, thus, may be applied to a thin film transistor included in a display device.

The target object 410 to be processed may be seated on the stage 400. A stage moving unit 430 may move the stage 400 in a predetermined direction. The stage 400 may be moved continuously or intermittently.

The laser processing apparatus according to an exemplary embodiment of the invention may further include a control unit 500. The control unit 500 may control the overall operation of the laser beam generating unit 100, the lens unit 200 and the stage moving unit 430.

More specifically, the laser beam generating unit 100 may receive a first control signal CONT1 and adjust the output, shape, or wavelength of the laser beam L1. The lens unit 200 may receive a second control signal CONT2 and move at least one of the first lens unit 210 and the second lens unit 220 in a predetermined direction such that the central axis of the first lens unit 210 is deviated from the central axis of the second lens unit 220. Further, the stage moving unit 430 may receive a third control signal CONT3 and move the target object 410 in a designated direction.

Figure 2:
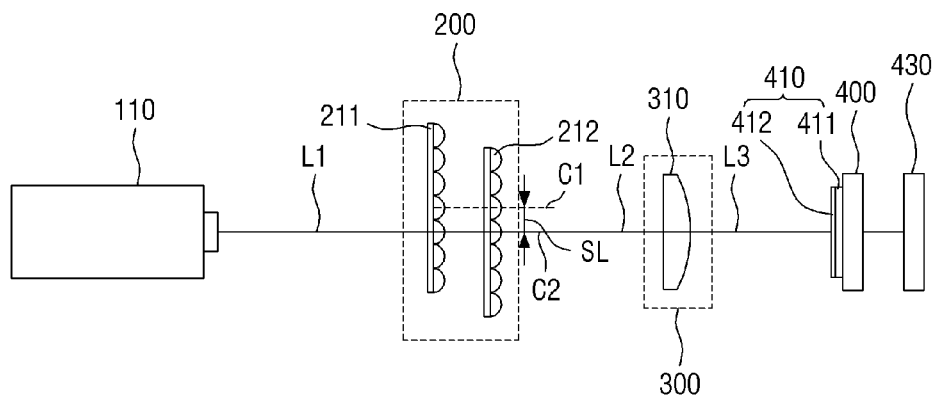
FIG. 2 is a diagram specifically showing an exemplary embodiment of the laser processing apparatus shown in FIG. 1.

FIG. 2 is a diagram specifically showing an exemplary embodiment of the laser processing apparatus shown in FIG. 1. The laser processing apparatus according to an exemplary embodiment of the invention will be described in detail with reference to FIG. 2. However, a repeated description similar to the description with reference to FIG. 1 will be omitted.

The laser beam generating unit 100 may include at least one laser light source 110. The laser light source 110 may be oscillated at a pulse frequency of about 2 kilohertz (kHz) to about 4 kHz in an exemplary embodiment. The type of the laser light source 110 is not particularly limited and may be changed depending on the type of the target object 410.

The lens unit 200 may include a first lens array 211 and a second lens array 212. The first lens array 211 may be included in the first lens unit 210 (refer to FIG. 1), and the second lens array 212 may be included in the second lens unit 220 (refer to FIG. 1).

The first lens array 211 and the second lens array 212 may divide the laser beam L1 into a plurality of laser beams L2 in a direction corresponding to the long axis direction of the laser beam L1. The first lens array 211 and the second lens array 212 may be long-axis cylindrical microlens arrays in an exemplary embodiment.

The first lens array 211 and the second lens array 212 may be spaced apart from each other by a predetermined distance in an optical axis direction of the laser beam L1. The focal lengths of the first lens array 211 and the second lens array 212 may be determined by the focal length of each lens array, the spacing distance between the lens arrays, and the distance of the laser beam L1 in the optical axis direction. The first lens array 211 and the second lens array 212 may be moved such that their central axes are deviated from each other.

The light condensing unit 300 may include at least one condensing lens 310. The condensing lens 310 may condense a plurality of incident laser beams L2 and provide the condensed laser beam L2 to the target object 410. The condenser lens 310 may be a long-axis condensing lens in an exemplary embodiment. The plurality of laser beams L2 may be shaped on the surface of the target object 410 by the condensing lens 310 into a laser beam L3 having a predetermined shape along the long axis direction.

A reciprocating motion of the first lens array 211 and the second lens array 212 will be described in more detail with reference to FIGS. 2 to 5.

FIGS. 3A to 5 are diagrams showing an exemplary embodiment of the reciprocating motion of the first lens array and the second lens array shown in FIG. 2.

Referring to FIGS. 2 to 5, the first lens array 211 may have a first central axis C1. The second lens array 212 may have a second central axis C2. The lens unit 200 may further include a lens array moving device (not shown).

The lens array moving device may reciprocate at least one of the first lens array 211 and the second lens array 212 in the direction corresponding to the long axis direction of the laser beam L1. The lens array moving device may be an electric actuator or a vibrating element in an exemplary embodiment. The lens array moving device may reciprocate at least one of the first lens array 211 and the second lens array 212 in a constant cycle.

Figure 3A:
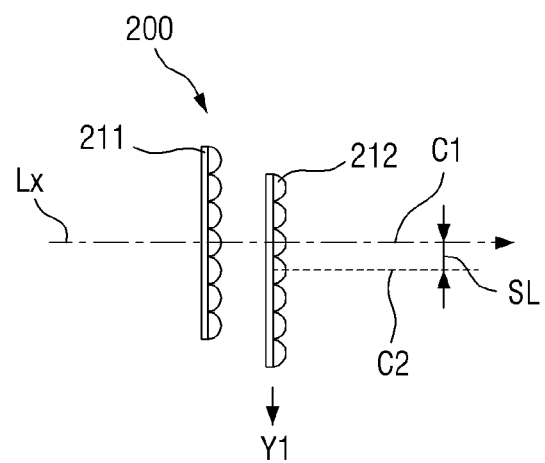
FIGS. 3A to 5 are diagrams showing an exemplary embodiment of the reciprocating motion of the first lens array and the second lens array shown in FIG. 2.

Referring to FIG. 3A, the first lens array 211 does not move. The first central axis C1 of the first lens array 211 may be located on the same line as an optical axis Lx of the laser beam. The second lens array 212 may reciprocate in a first direction Y1. The second central axis C2 of the second lens array 212 may be spaced apart by a predetermined distance from the optical axis Lx of the laser beam, i.e., the first central axis C1.

Figure 3B:
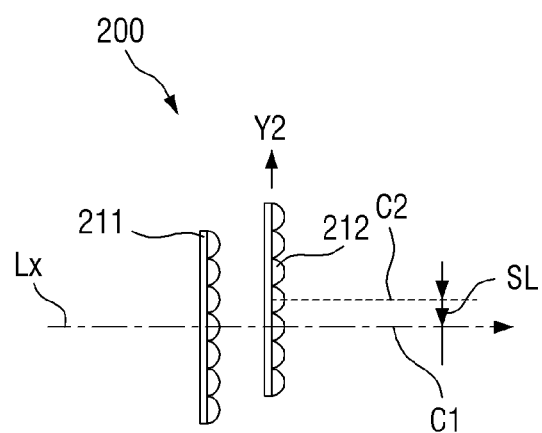

Referring to FIG. 3B, the second lens array 212 may reciprocate in a second direction Y2 opposed to the first direction Y1 (refer to FIG. 3A). The second central axis C2 of the second lens array 212 may be spaced apart by a predetermined distance from the optical axis Lx of the laser beam, i.e., the first central axis C1.

Figure 4A:
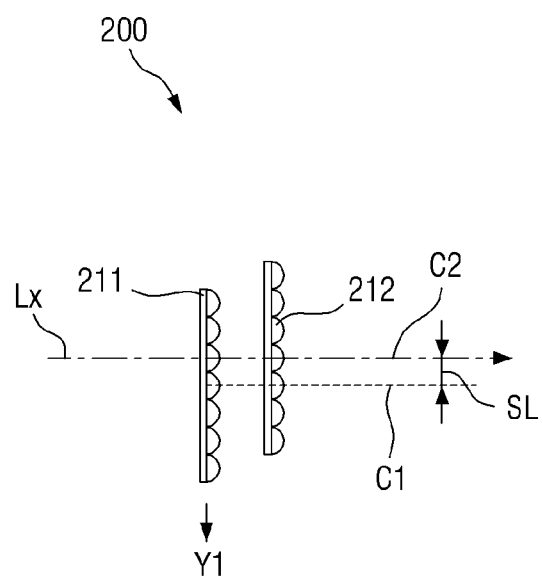

Referring to FIG. 4A, the second lens array 212 does not move. The second central axis C2 of the second lens array 212 may be located on the same line as the optical axis Lx of the laser beam. The first lens array 211 may reciprocate in the first direction Y1. The first central axis C1 of the first lens array 211 may be spaced apart by a predetermined distance from the optical axis Lx of the laser beam, i.e., the second central axis C2.

Figure 4B:
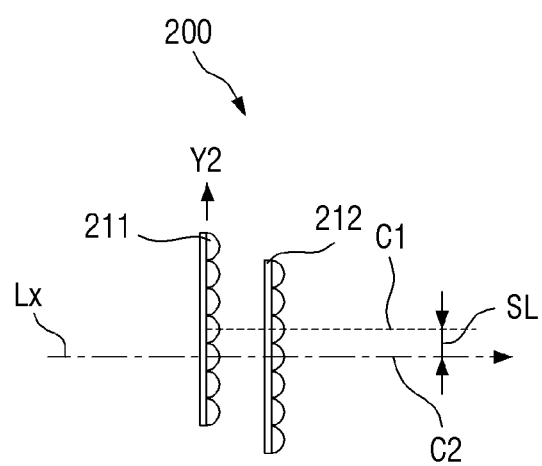

Referring to FIG. 4B, the first lens array 211 may reciprocate in the second direction Y2. The first central axis C1 of the first lens array 211 may be spaced apart by a predetermined distance from the optical axis Lx of the laser beam, i.e., the second central axis C2.

Figure 5:
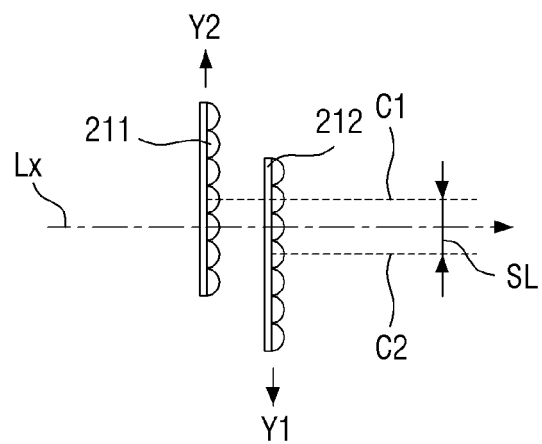

Referring to FIG. 5, both the first lens array 211 and the second lens array 212 may reciprocate in the first direction Y1 or the second direction Y2.

Here, each of the first direction Y1 and the second direction Y2 corresponds to the long axis direction of the optical axis Lx of the laser beam. A distance SL between the first central axis C1 and the second central axis C2 may be smaller than the lens width of the first lens array 211 and the second lens array 212 in an exemplary embodiment. In an exemplary embodiment, the distance SL between the first central axis C1 and the second central axis C2 shown in FIGS. 3 to 5 may be about 5 micrometers (μm) to about 200 μm in an exemplary embodiment.

However, the reciprocating motion of the first lens array 211 and the second lens array 212 is not limited to those shown in FIGS. 3 to 5. That is, the first lens array 211 and the second lens array 212 may move in the same direction and at the same speed, for example, while the central axis of the first lens array 211 is deviated from the central axis of the second lens array 212.

As the first lens array 211 and the second lens array 212 reciprocate, the incident angle and intensity of the plurality of laser beams L2 incident on the condensing lens 310 may be continuously changed. Thus, the uniformity of the laser beam L3 in the long axis direction on the surface of the target object 410 may be changed. That is, the condensing lens 310 may superpose the plurality of laser beams L2 on the surface of the target object 410 in the long axis direction.

Accordingly, a vertical stripe phenomenon generated on the surface of the target object 410 may be reduced. Here, the vertical stripe refers to a stripe perpendicular to the long axis direction of the laser beam L1.

In an exemplary embodiment, the reciprocating frequency of at least one of the first lens array 211 and the second lens array 212 may be about 0 Hertz (Hz) to about 300 Hz, for example. When the reciprocating frequency is increased, not only a vertical stripe phenomenon but also a horizontal stripe phenomenon may be reduced. Here, the horizontal stripe refers to a stripe parallel to the long axis direction of the laser beam L1.

A relationship between the reciprocating motion of the first lens array 211 and the second lens array 212 and the energy intensity of the laser beam will be described in more detail with reference to FIGS. 6 to 8.

FIGS. 6A to 8 are diagrams showing energy intensity distributions of laser beams in accordance with the reciprocating motion of the first lens array and the second lens array shown in FIG. 2. In the graphs shown in FIGS. 6 to 8, the horizontal axis represents the position of the laser beam in the long axis direction, and the vertical axis represents the energy intensity of the laser beam.

Figure 6A:
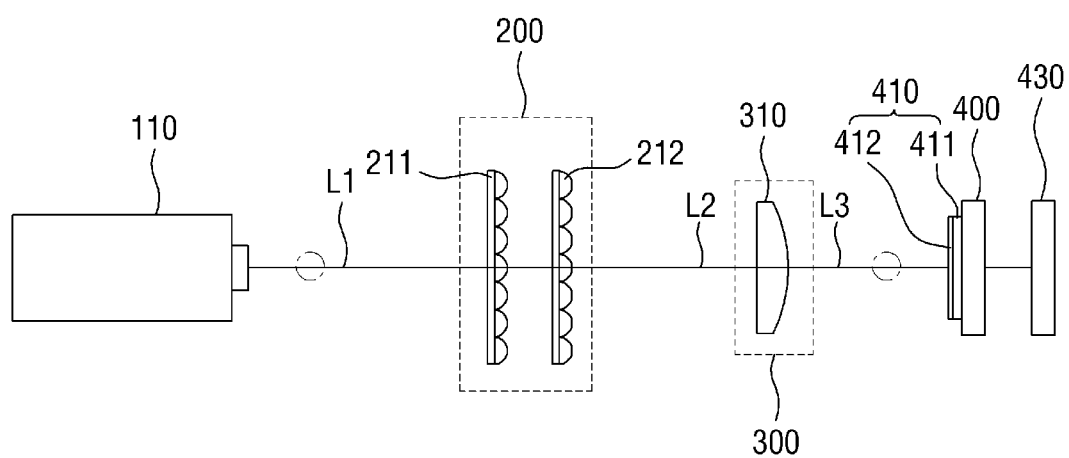
FIGS. 6A to 8 are diagrams showing energy intensity distributions of laser beams in accordance with the reciprocating motion of the first lens array and the second lens array shown in FIG. 2.
Figure 6B:
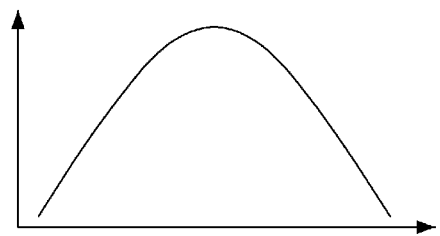
Figure 6C:
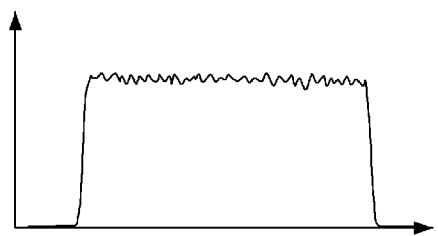

Referring to FIGS. 6A to 6C, the laser intensity distribution of the laser beam L1 emitted from the laser light source 110 may have a parabolic shape, for example. The laser intensity distribution of the laser beam L3 condensed by the condensing lens 310 may be flattened by the first lens array 211, the second lens array 212 and the condensing lens 310. However, generally, interference may occur due to scattered light on the surfaces of the lenses of the first lens array 211 and the second lens array 212, and this interference may cause an interference pattern in which the energy intensity distribution of the laser beam L3 is severely uneven. This may lead to the above-described vertical stripe phenomenon.

Figure 7A:
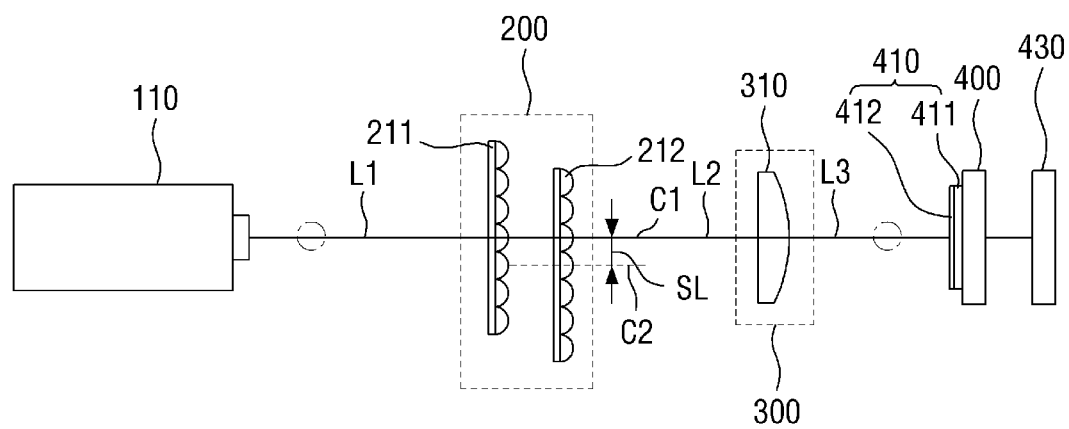
Figure 7B:
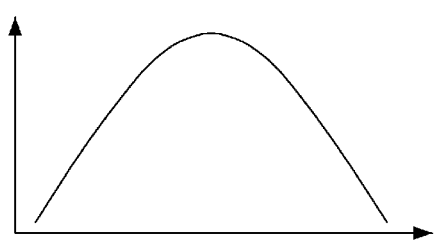
Figure 7C:
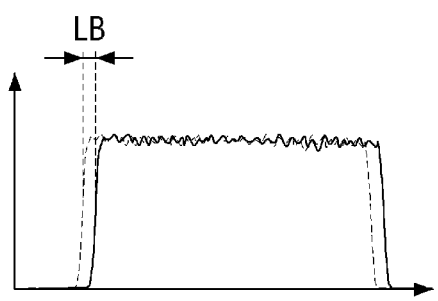

Referring to FIGS. 7A to 7C, at least one of the first lens array 211 and the second lens array 212 may reciprocate such that the central axes of the first lens array 211 and the second lens array 212 are deviated from each other. Accordingly, the incident angle and the intensity of the plurality of laser beams L2 incident on the condensing lens 310 may be continuously changed. That is, the uniformity of the laser beam L3 in the long axis direction on the surface of the target object 410 may be changed.

Further, the phase of the energy intensity of the laser beam L3 may be shifted by a predetermined distance LB. This means that, even when an interference pattern exists, it may be sufficiently dispersed. Here, when the central axes of the first lens array 211 and the second lens array 212 are deviated from each other by about 5 μm to about 200 μm, for example, the phase shift distance LB of the energy intensity may be about 3 millimeters (mm) to about 30 mm, for example.

Figure 8:
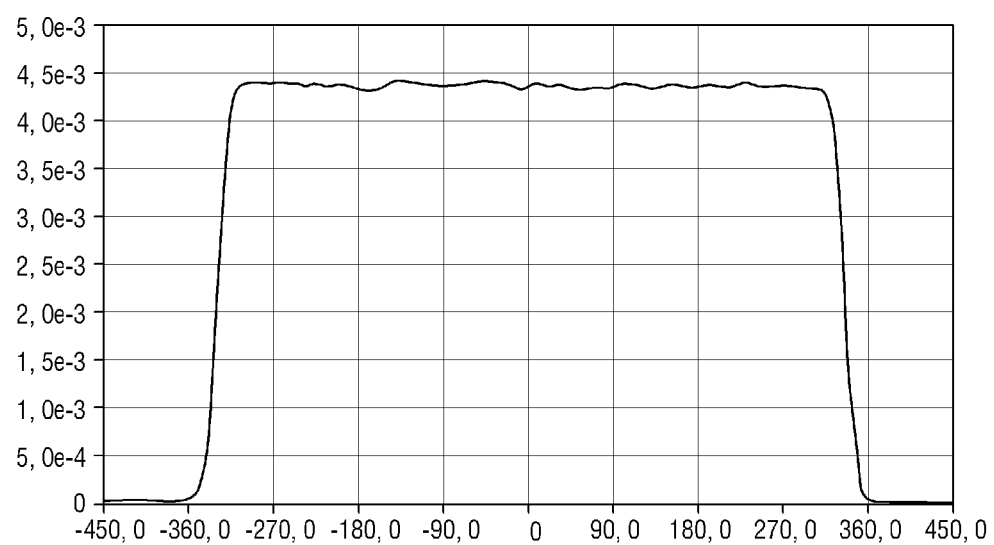

Referring to FIG. 8, the energy intensity distribution of the laser beam L3 may be further flattened as at least one of the first lens array 211 and the second lens array 212 reciprocates such that the central axes of the first lens array 211 and the second lens array 212 are deviated from each other. That is, the energy intensity distribution of the laser beam L3 may have a flat top shape with a predetermined size. In an exemplary embodiment, the size of the flat top shape may be about 100 mm to about 1500 mm.

The target object 410 may receive the laser beam L3 of which energy intensity is averaged. As a result, the vertical stripe phenomenon may be reduced. In particular, the semiconductor film 412 may have uniform grain characteristics in the entire region irradiated with the laser beam L3.

Although not shown in the drawing, the laser processing apparatus according to an exemplary embodiment of the invention may further include a beam expanding unit positioned on a path between the laser light source 110 and the lens unit 200. The beam expanding unit may enlarge the diameter of the laser beam L1 emitted from the laser light source 110 and provide the enlarged diameter to the lens unit 200.

In an exemplary embodiment, the beam expanding unit may enlarge the diameter of the laser beam L1 in the long axis direction. In another exemplary embodiment, the beam expanding unit may enlarge the diameter of the laser beam L1 in the short axis direction. The beam expanding unit may set an enlargement ratio in the long axis direction and the short axis direction, respectively. To this end, the beam expanding unit may include at least one of a convex lens, a concave lens, and a cylindrical lens, for example.

Further, the laser processing apparatus according to an exemplary embodiment of the invention may further include a path converting unit for converting a path of the laser beam in at least one of the path of the laser beam L1, the path of the plurality of laser beams L2 emitted from the lens unit 200, and the path of the laser beam L3 condensed by the light condensing unit 300. In an exemplary embodiment, the path converting unit may include at least one reflection mirror, for example. The number of reflection mirrors may be determined in consideration of an arrangement relationship of the components.

Figure 9:
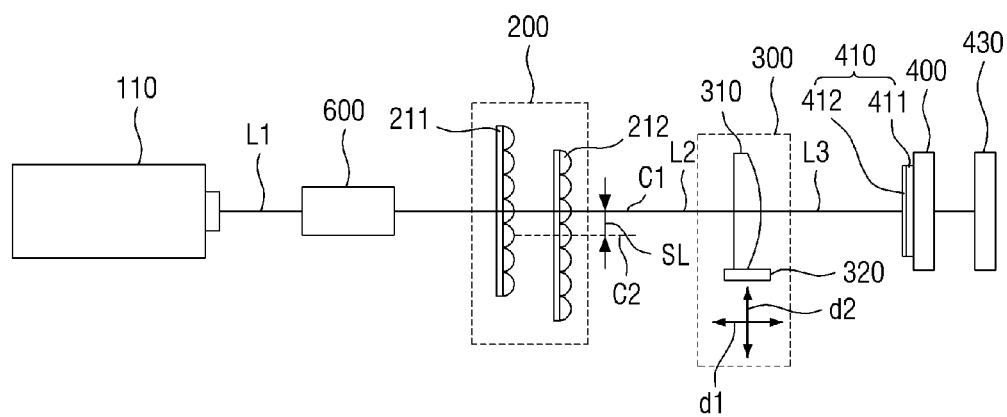
FIG. 9 is a diagram showing a laser processing apparatus according to another exemplary embodiment of the invention.

FIG. 9 is a diagram showing a laser processing apparatus according to another exemplary embodiment of the invention. A repeated description similar to the description with reference to FIGS. 1 to 8 will be omitted.

The laser processing apparatus according to another exemplary embodiment of the invention may further include a lens moving unit 320. The lens moving unit 320 may reciprocate the condensing lens 310 in a first direction d1 or a second direction d2. Here, the direction of the reciprocating motion may be determined according to the moving direction of the first lens array 211 and the second lens array 212.

Figure 10:
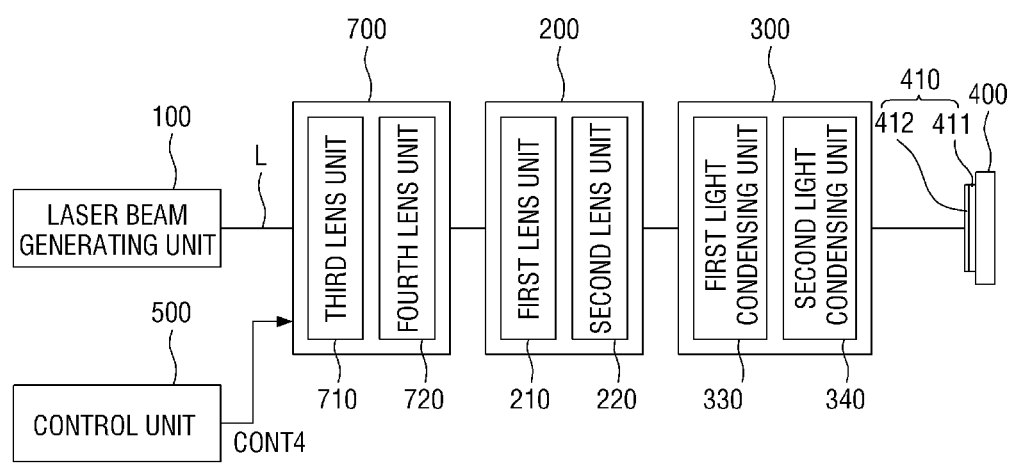
FIG. 10 is a block diagram schematically showing a laser processing apparatus according to still another exemplary embodiment of the invention.
Figure 11:
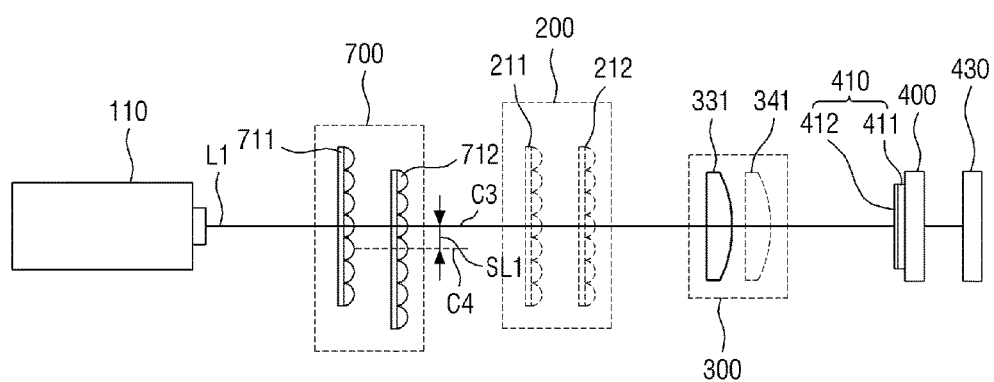
FIG. 11 is a diagram specifically showing an exemplary embodiment of the laser processing apparatus shown in FIG. 10.

FIG. 10 is a block diagram schematically showing a laser processing apparatus according to still another exemplary embodiment of the invention. FIG. 11 is a diagram specifically showing an exemplary embodiment of the laser processing apparatus shown in FIG. 10. In FIG. 11, a component that acts in the long axis direction of the laser beam is shown by a dotted line. A repeated description similar to the description with reference to FIGS. 1 to 9 will be omitted. Hereinafter, reference numeral 200 denotes a long-axis lens unit 200.

Referring again to FIG. 9, a path converting unit 600 may convert a path of the laser beam L. The path converting unit 600 may include at least one reflection mirror. The number of reflection mirrors may be determined in consideration of the arrangement relationship of the components. The position of the path converting unit 600 is not limited to that shown in FIG. 9.

Referring again to FIGS. 10 and 11, a short-axis lens unit 700 may include a third lens unit 710 and a fourth lens unit 720. That is, the short-axis lens unit 700 may be a short-axis homogenizer. The third lens unit 710 may include a third lens array 711 and the fourth lens unit 720 may include a fourth lens array 712. The third lens array 711 and the fourth lens array 712 may divide the laser beam L into a plurality of laser beams in a direction corresponding to a short axis direction of the laser beam L. The third lens array 711 and the fourth lens array 712 may be short-axis cylindrical microlens arrays in an exemplary embodiment.

The third lens array 711 and the fourth lens array 712 may be spaced apart from each other by a predetermined distance in an optical axis direction of the laser beam L1. The third lens array 711 and the fourth lens array 712 may be reciprocated such that their central axes are deviated from each other. In an exemplary embodiment, a distance SL1 may be defined between the third central axis C3 and the fourth central axis C4.

More specifically, the short-axis lens unit 700 may receive a fourth control signal CONT4 from the control unit 500 and reciprocate at least one of the third lens array 711 and the fourth lens array 712.

The light condensing unit 300 may include a first light condensing unit 330 and a second condensing unit 340. In an exemplary embodiment, the first light condensing unit 330 includes a short-axis condensing lens 331 and the second condensing unit 340 includes a long-axis condensing lens 341. The short-axis condensing lens 331 may condense a plurality of incident laser beams and provide the condensed laser beam to the target object 410. That is, the plurality of laser beams may be shaped on the surface of the target object 410 by the condensing lens 310 into a laser beam having a predetermined shape along the short axis direction.

That is, as the third lens array 711 and the fourth lens array 712 reciprocate, the incident angle and the intensity of the plurality of laser beams incident on the short-axis condensing lens 331 may be continuously changed. Thus, the uniformity of the laser beam in the short axis direction on the surface of the target object 410 may be changed. Accordingly, a horizontal stripe phenomenon generated on the surface of the target object 410 may be reduced.

Although certain exemplary embodiments and implementations have been described herein, other exemplary embodiments and modifications will be apparent from this description. Accordingly, the invention is not limited to such exemplary embodiments, but rather to the broader scope of the presented claims and various obvious modifications and equivalent arrangements.

What is claimed is:

1. A laser processing apparatus comprising:
a laser beam generating unit which emits a laser beam;
a lens unit which divides the laser beam into a plurality of laser beams and includes a first lens array having a first central axis and a second lens array having a second central axis, the first and second lens arrays being contiguous to one another; and
a light condensing unit which condenses the plurality of laser beams,
wherein at least one of the first lens array and the second lens array reciprocates such that the first central axis and the second central axis are deviated from each other.

2. The laser processing apparatus of claim 1, wherein the lens unit divides the laser beam in a long axis direction of the laser beam, and
wherein at least one of the first lens array and the second lens array reciprocates in the long axis direction.

3. The laser processing apparatus of claim 2, wherein the lens unit is a long-axis homogenizer.

4. The laser processing apparatus of claim 1, wherein the lens unit divides the laser beam in a short axis direction of the laser beam, and
wherein at least one of the first lens array and the second lens array reciprocates in the short axis direction.

5. The laser processing apparatus of claim 4, wherein the lens unit is a short-axis homogenizer.

6. The laser processing apparatus of claim 1, wherein the first lens array and the second lens array are cylindrical microlens arrays.

7. The laser processing apparatus of claim 1, wherein a distance between the first central axis and the second central axis is about 5 micrometers to about 200 micrometers.

8. The laser processing apparatus of claim 1, wherein a motion frequency of at least one of the first lens array and the second lens array is greater than about 0 Hertz and equal to or less than about 300 Hertz.

9. The laser processing apparatus of claim 1, wherein an energy intensity distribution of the laser beam condensed by the light condensing unit has a flat top shape.

10. The laser processing apparatus of claim 1, wherein the first lens array and the second lens array reciprocate in the same direction and at the same motion frequency while the first central axis and the second central axis are deviated from each other.

11. A laser processing apparatus comprising:
a laser beam generating unit which emits a laser beam; and
a lens unit which flattens an energy intensity distribution of the laser beam and includes a first lens array and a second lens array spaced apart from the first lens array by a predetermined distance, the first and second lens arrays being contiguous to one another, and
wherein at least one of the first lens array and the second lens array reciprocates such that central axes of the first lens array and the second lens array are deviated from each other.

12. The laser processing apparatus of claim 11, wherein the lens unit flattens the energy intensity distribution of the laser beam in a long axis direction of the laser beam, and at least one of the first lens array and the second lens array reciprocates in the long axis direction.

13. The laser processing apparatus of claim 11, wherein the lens unit flattens the energy intensity distribution of the laser beam in a short axis direction of the laser beam, and at least one of the first lens array and the second lens array reciprocates in the short axis direction.

14. The laser processing apparatus of claim 11, further comprising a light condensing unit which condenses the laser beam emitted from the lens unit onto a target object to be processed,
wherein the light condensing unit superposes the laser beam emitted from the lens unit in a long axis direction or a short axis direction of the laser beam.

15. The laser processing apparatus of claim 11, wherein a motion frequency of at least one of the first lens array and the second lens array is greater than 0 and equal to or less than 300 Hertz.

16. The laser processing apparatus of claim 11, wherein the first lens array and the second lens array are cylindrical microlens arrays.

17. The laser processing apparatus of claim 11, wherein the central axes of the first lens array and the second lens array are deviated from each other by about 5 micrometers to about 200 micrometers.

18. A laser processing method comprising:
emitting a laser beam to a lens unit;
dividing, by the lens unit, the laser beam into a plurality of laser beams; and
condensing the plurality of laser beams,
wherein the lens unit includes a first lens array and a second lens array, the first and second lens arrays being contiguous to one another, and
wherein at least one of the first lens array and the second lens array reciprocates such that central axes of the first lens array and the second lens array are deviated from each other.

19. The laser processing method of claim 18, wherein the lens unit divides the laser beam in a long axis direction of the laser beam, and
wherein at least one of the first lens array and the second lens array reciprocates in the long axis direction.

20. The laser processing method of claim 18, wherein the first lens array and the second lens array are cylindrical microlens arrays, and a motion frequency of at least one of the first lens array and the second lens array is greater than about 0 Hertz and equal to or less than 300 Hertz.

21. The laser processing method of claim 18, wherein any condensing lens is not disposed between the first lens array and the second lens array.

* * * * *